United States Patent
Jang et al.

(10) Patent No.: US 11,682,569 B2
(45) Date of Patent: Jun. 20, 2023

(54) WORKPIECE CUTTING METHOD

(71) Applicant: DISCO CORPORATION, Tokyo (JP)

(72) Inventors: Byeongdeck Jang, Tokyo (JP);
Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 398 days.

(21) Appl. No.: 17/010,307

(22) Filed: Sep. 2, 2020

(65) Prior Publication Data

US 2021/0074559 A1    Mar. 11, 2021

(30) Foreign Application Priority Data

Sep. 5, 2019 (JP) .............................. JP2019-162133

(51) Int. Cl.
*H01L 21/67* (2006.01)
*H01L 23/544* (2006.01)
*H01L 21/78* (2006.01)

(52) U.S. Cl.
CPC ........ *H01L 21/67092* (2013.01); *H01L 21/78* (2013.01); *H01L 23/544* (2013.01); *H01L 2223/5446* (2013.01)

(58) Field of Classification Search
None
See application file for complete search history.

(56) References Cited

U.S. PATENT DOCUMENTS

| | | | | |
|---|---|---|---|---|
| 2005/0009302 A1* | 1/2005 | Wakui | ..................... | H01L 21/78 438/464 |
| 2005/0223570 A1* | 10/2005 | Yonezawa | ............... | C03C 17/36 33/18.1 |
| 2007/0173035 A1* | 7/2007 | Izumi | ...................... | H01L 21/78 438/464 |
| 2009/0049964 A1* | 2/2009 | Yagyu | .................. | B24B 13/015 83/34 |
| 2010/0181681 A1* | 7/2010 | Akiba | ..................... | H01L 21/78 257/773 |
| 2011/0108883 A1* | 5/2011 | Tsukamoto | ......... | H01L 29/7395 257/144 |
| 2015/0099428 A1* | 4/2015 | Fujita | ..................... | B24B 27/06 451/28 |
| 2015/0303075 A1* | 10/2015 | Han | ........................ | H01L 24/97 438/113 |

(Continued)

FOREIGN PATENT DOCUMENTS

| | | |
|---|---|---|
| JP | 2011054751 A | 3/2011 |
| JP | 2018056501 A | 4/2018 |

*Primary Examiner* — Erik T. K. Peterson
(74) *Attorney, Agent, or Firm* — Greer Burns & Crain Ltd.

(57) ABSTRACT

A workpiece cutting method of cutting a workpiece along a plurality of crossing division lines formed on a front side of the workpiece, by using a cutting blade having a thickness gradually decreasing toward an outer circumference of the cutting blade. The workpiece cutting method includes a shape checking step of checking a shape of the cutting blade; a cut depth setting step of setting a cut depth by the cutting blade into the workpiece according to the shape checked in the shape checking step such that a width of a cut groove to be formed on the front side of the workpiece becomes a previously set value; and a cutting step of cutting the workpiece with the cut depth set in the cut depth setting step, by forcing the cutting blade into the workpiece from the front side thereof.

4 Claims, 9 Drawing Sheets

(56) References Cited

U.S. PATENT DOCUMENTS

| | | | |
|---|---|---|---|
| 2016/0133784 A1* | 5/2016 | Minamiru | H01L 21/78 |
| | | | 438/33 |
| 2016/0297091 A1* | 10/2016 | Komatsu | H01L 21/78 |
| 2018/0096948 A1* | 4/2018 | Kim | B23K 26/402 |
| 2018/0182715 A1* | 6/2018 | Kim | H01L 23/49838 |
| 2019/0202018 A1* | 7/2019 | Komatsu | B24B 3/36 |

* cited by examiner

WORKPIECE CUTTING METHOD

BACKGROUND OF THE INVENTION

Field of the Invention

The present invention relates to a workpiece cutting method.

Description of the Related Art

Conventionally known is a cutting apparatus for cutting a workpiece such as a semiconductor wafer along a plurality of division lines in the condition where the workpiece is held on a chuck table, thereby dividing the workpiece into individual device chips. This kind of cutting apparatus includes a technique of cutting a package substrate by using a cutting blade having a sectionally V-shaped cutting edge and next forming a shield layer on the side surface and the upper surface of the package substrate divided (see Japanese Patent Laid-Open No. 2018-56501, for example).

SUMMARY OF THE INVENTION

In the above technique, the cutting edge of the cutting blade has a V-shaped cross section. Accordingly, a cut groove formed on the front side of the workpiece (package substrate) by using this cutting blade also has a V-shaped cross section, and the width of this cut groove is largest on the front side of the workpiece. Unless the shape of the cutting blade and a cut depth by the cutting blade into the workpiece are well controlled, there is a possibility that the width of the cut groove may become larger than the width of each division line, so that the cut groove may also be formed in a device area formed on the front side of the package substrate.

It is therefore an object of the present invention to provide a workpiece cutting method which can form a cut groove along each division line on the front side of a workpiece in the condition where the width of the cut groove is less than the width of each division line.

In accordance with an aspect of the present invention, there is provided a workpiece cutting method of cutting a workpiece along a plurality of crossing division lines formed on a front side of the workpiece, by using a cutting blade having a thickness gradually decreasing toward an outer circumference of the cutting blade. The workpiece cutting method includes a shape checking step of checking a shape of the cutting blade, a cut depth setting step of setting a cut depth by the cutting blade into the workpiece according to the shape checked in the shape checking step such that a width of a cut groove to be formed on the front side of the workpiece becomes a previously set value, and a cutting step of cutting the workpiece with the cut depth set in the cut depth setting step, by forcing the cutting blade into the workpiece from the front side thereof.

Preferably, the shape checking step includes a transfer step of cutting a dummy workpiece or the workpiece by using the cutting blade to form a test cut groove in the dummy workpiece or in the workpiece, thereby transferring the shape of the cutting blade to the test cut groove, and an imaging step of imaging a cross section of the test cut groove formed in the transfer step.

Preferably, the workpiece is a package substrate including a wiring substrate having a front side partitioned by the division lines to define a plurality of separate regions, a plurality of chips individually provided in the plurality of separate regions on the front side of the wiring substrate, and a plastic molding layer for sealing the plurality of chips with resin, the front side of the package substrate as the workpiece being an upper surface of the plastic molding layer from which the cutting blade is forced into the package substrate in the cutting step.

The above and other objects, features, and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will now be described in detail with reference to the drawings. The present invention is not limited to these preferred embodiments. Further, the components used in the preferred embodiments may include those that can be easily assumed by persons skilled in the art or substantially the same elements as those known in the art. Further, the configurations described below may be suitably combined. Further, the configurations may be variously omitted, replaced, or changed without departing from the scope of the present invention.

First Preferred Embodiment

Figure 1:
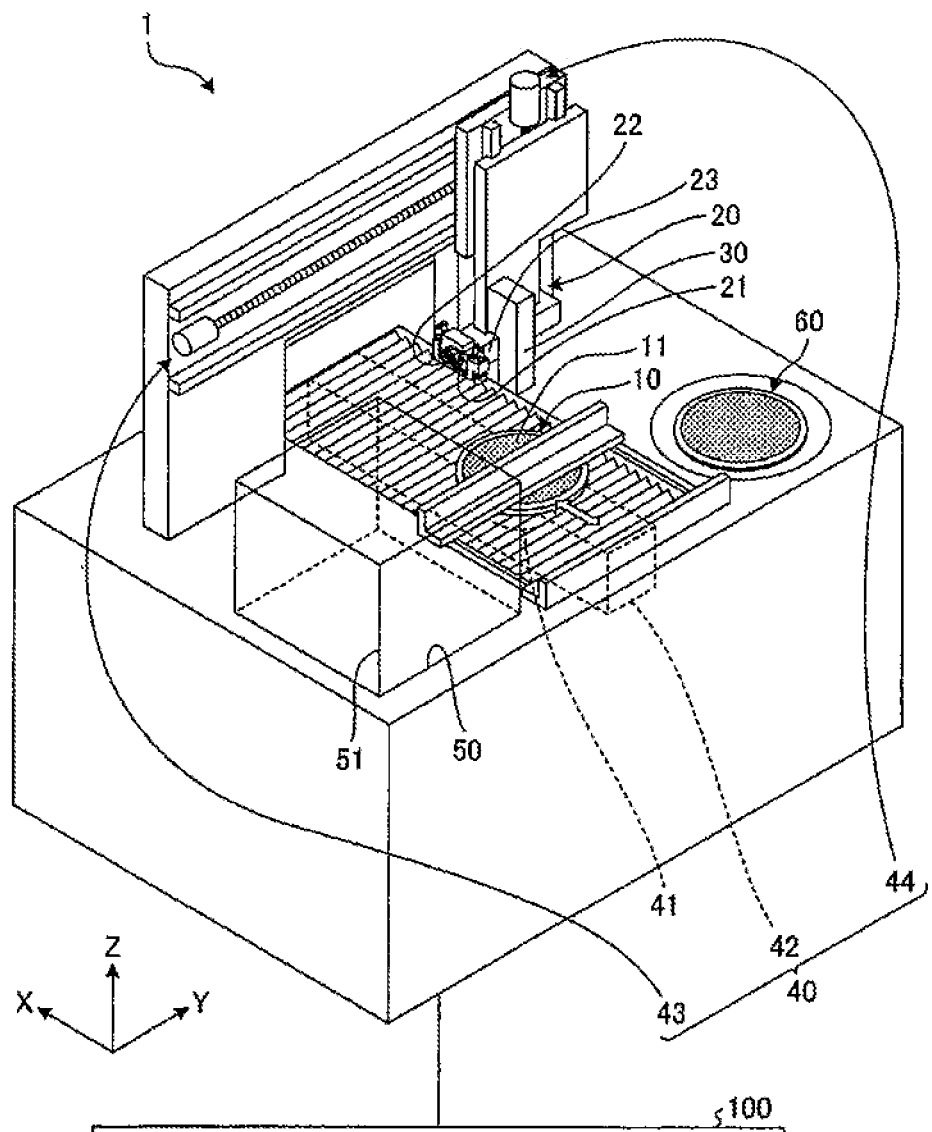
FIG. 1 is a perspective view of a cutting apparatus for performing a cutting method according to a first preferred embodiment.
Figure 1:
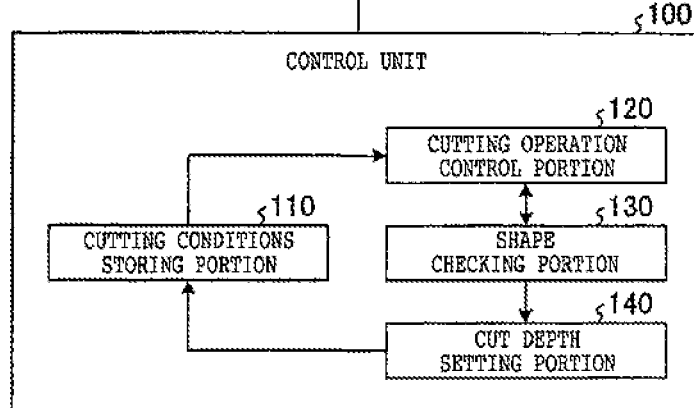

There will now be described a cutting apparatus 1 according to a first preferred embodiment with reference to FIG. 1. The cutting apparatus 1 depicted in FIG. 1 is an apparatus for cutting a workpiece 200 depicted in FIG. 2 by using a cutting blade 21 to thereby divide the workpiece 200 into a plurality of individual device chips including a plurality of respective devices 205 depicted in FIG. 2. The workpiece 200 in this preferred embodiment is a disk-shaped wafer such as a semiconductor wafer and an optical device wafer. The workpiece 200 has a substrate 201-1 formed of silicon, sapphire, or gallium arsenide, for example. The substrate 201-1 has a front side 202 and a back side 206 opposite to the front side 202. A plurality of crossing streets 203 and 204 are formed in a grid pattern on the front side 202 of the substrate 201-1 to thereby define a plurality of separate regions where a plurality of devices 205 are individually formed. In the first preferred embodiment, the plural streets 203 are parallel to each other, and the plural streets 204 are parallel to each other. The plural streets 203 are perpendicular to the plural streets 204.

Figure 2:
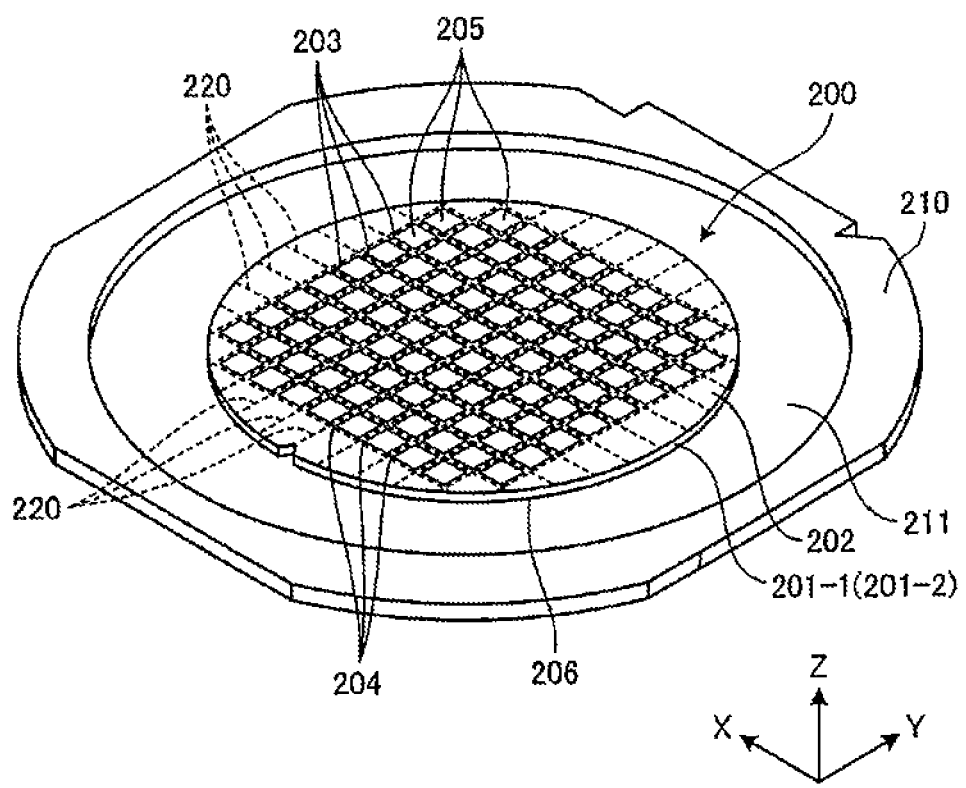
FIG. 2 is a perspective view of a workpiece to be cut by the cutting apparatus depicted in FIG. 1.

As a modification, the workpiece 200 depicted in FIG. 2 may be a so-called TAIKO (registered trademark) wafer having a central circular thin-walled portion and a peripheral annular thick-walled portion surrounding this central circular thin-walled portion. Further, the workpiece 200 may be a rectangular package substrate having a plurality of devices sealed with resin. Further, the workpiece 200 may be a ceramic substrate, a ferrite substrate, a glass substrate, or a substrate including at least one of nickel and iron, in which the devices 205 and the streets 203 and 204 are not set on each substrate.

As depicted in FIG. 2, the back side 206 of the substrate 201-1 of the workpiece 200 is attached to a central portion of a circular adhesive tape 211. An annular ring frame 210 is attached to a peripheral portion of the circular adhesive tape 211. Thus, the workpiece 200 is supported through the adhesive tape 211 to the ring frame 210.

Further, as depicted in FIG. 2, a plurality of crossing linear division lines 220 depicted by broken lines are set on the front side 202 of the substrate 201-1 of the workpiece 200. Each division line 220 is an imaginary line indicating a position where the cutting blade 21 is forced into the workpiece 200 to cut the same. The plural crossing division lines 220 are composed of a first group corresponding to the plural streets 203 and a second group corresponding to the plural streets 204. That is, each division line 220 is set inside each of the streets 203 and 204 so as to be parallel thereto and also set outside the outermost ones of the devices 205 so as to be parallel to the streets 203 and 204. In particular, each division line 220 set inside each of the streets 203 and 204 is located on the lateral center of each of the streets 203 and 204 so as to extend along the whole length of each of the streets 203 and 204.

In the cutting method to be hereinafter described according to this preferred embodiment, a step using a dummy workpiece 201-2 is performed prior to cutting the substrate 201-1 as an actual workpiece. The dummy workpiece 201-2 is a test piece to be cut by the cutting blade 21 for the purpose of simulation cutting. The dummy workpiece 201-2 has the same size as that of the substrate 201-1.

(Cutting Apparatus)

The cutting apparatus 1 depicted in FIG. 1 includes at least a holding table 10 having a holding surface 11 for holding the workpiece 200 under suction, a cutting unit 20 cutting the workpiece 200 held on the holding table 10 as cutting means having a spindle 22 adapted to be rotated and a cutting blade 21 mounted on the spindle 22, an imaging unit 30 imaging the workpiece 200 held on the holding table 10, a moving unit 40 as moving means relatively moving the holding table 10 and the cutting unit 20, and a control unit 100 as control means for controlling the holding table 10, the cutting unit 20, the imaging unit 30, and the moving unit 40.

The moving unit 40 includes at least a rotational drive source 41, an X moving unit 42, a Y moving unit 43, and a Z moving unit 44. The rotational drive source 41 functions to rotate the holding table 10 about its axis parallel to the Z direction depicted by an arrow Z, the Z direction being parallel to a vertical direction. The X moving unit 42 functions to move the holding table 10 in the X direction depicted by an arrow X parallel to a horizontal direction. The Y moving unit 43 functions to move the cutting unit 20 in the Y direction depicted by an arrow Y parallel to another horizontal direction and perpendicular to the X direction. The Z moving unit 44 functions to move the cutting unit 20 in the Z direction perpendicular to both the X direction and the Y direction.

The holding table 10 is a disk-shaped member, and the holding surface 11 for holding the workpiece 200 is formed of porous ceramic, for example. The holding table 10 is movable in the X direction by the X moving unit 42 and rotatable about its axis parallel to the Z direction by the rotational drive source 41. The holding surface 11 of the holding table 10 is connected to a vacuum source (not depicted) for producing a vacuum. Accordingly, when the vacuum source is operated, the vacuum produced by the vacuum source is applied to the holding surface 11, thereby holding the workpiece 200 on the holding surface 11 under suction. That is, when the workpiece 200 supported through the adhesive tape 211 to the ring frame 210 is placed through the adhesive tape 211 on the holding surface 11 of the holding table 10, the workpiece 200 is sucked through the adhesive tape 211 to the holding surface 11 by the vacuum applied from the vacuum source to the holding surface 11. Accordingly, the workpiece 200 is held through the adhesive tape 211 on the holding surface 11 under suction.

Figure 3:
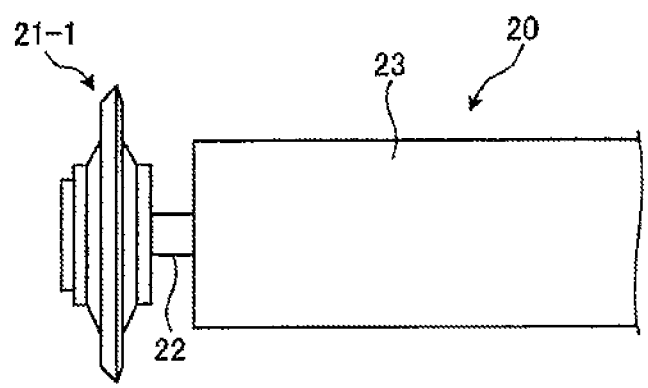
FIG. 3 is a side view of a cutting unit included in the cutting apparatus depicted in FIG. 1.

The cutting unit 20 is a unit including the cutting blade 21 for cutting the workpiece 200 held on the holding table 10. The cutting blade 21 of the cutting unit 20 is detachably mounted on the spindle 22 and rotatable by rotating the spindle 22. FIG. 3 is a side view of the cutting unit 20 according to the first preferred embodiment.

The cutting unit 20 depicted in FIG. 3 includes a cutting blade 21-1, a spindle 22 to which the cutting blade 21-1 is mounted, and a spindle housing 23 for rotatably supporting the spindle 22. The spindle housing 23 is movable in the Y direction by the Y moving unit 43 and also movable in the Z direction by the Z moving unit 44. Accordingly, the cutting unit 20 is movable in the Y direction by the Y moving unit 43 with respect to the workpiece 200 held on the holding table 10 and also movable in the Z direction by the Z moving unit 44 with respect to the workpiece 200 held on the holding table 10.

The cutting blade 21-1 of the cutting unit 20 can be moved to a freely selected position above the holding surface 11 of the holding table 10 by operating the Y moving unit 43 and the Z moving unit 44. The cutting blade 21-1 is an annular cutting wheel formed from abrasive and having a very small thickness. As depicted in FIG. 3, the cutting blade 21-1 has a sectionally V-shaped cutting edge having a thickness gradually decreasing toward the outer circumference of the cutting edge. The spindle 22 is adapted to be rotated by a spindle motor (not depicted), and the cutting blade 21-1 is mounted on a front end portion of the spindle 22. Accordingly, when the spindle motor is operated, the spindle 22 and the cutting blade 21-1 are rotated together about the axis of the spindle 22, so that the workpiece 200 is cut by the cutting blade 21-1 being rotated. The spindle 22 is rotatably supported in the spindle housing 23. Thus, the cutting blade 21-1 is mounted on the spindle 22 so as to be rotatable together with the spindle 22. The axis of the spindle 22 coincides with the axis of the cutting blade 21-1 mounted on the spindle 22, and the axis of the spindle 22 is parallel to the Y direction.

The imaging unit 30 is fixed to the cutting unit 20 so as to be movable together with the cutting unit 20. The imaging unit 30 includes an imaging device for imaging a target area of the workpiece 200 to be divided in the condition where the workpiece 200 is held on the holding table 10 before being cut. For example, the imaging device is a CCD (Charge Coupled Device) imaging device or a CMOS (Complementary MOS) imaging device. The imaging unit 30 functions to image the workpiece 200 held on the holding table 10 and thereby obtain an image for use in performing alignment between the workpiece 200 and the cutting blade 21-1, for example. This image obtained by the imaging unit 30 is output to the control unit 100.

The X moving unit 42 functions to move the holding table 10 in the X direction as a work feeding direction, thereby relatively moving the holding table 10 and the cutting unit 20 in the X direction. The Y moving unit 43 functions to move the cutting unit 20 in the Y direction as an indexing direction, thereby relatively moving the holding table 10 and the cutting unit 20 in the Y direction. The Z moving unit 44 functions to move the cutting unit 20 in the Z direction as a cutter feeding direction, thereby relatively moving the holding table 10 and the cutting unit 20 in the Z direction.

As known in the art, the X moving unit 42 includes an X ball screw rotatable about its axis extending in the X direction, an X motor for rotating the X ball screw about its axis, and a pair of X guide rails for supporting the holding table 10 so as to allow the movement thereof in the X direction. Similarly, the Y moving unit 43 includes a Y ball screw rotatable about its axis extending in the Y direction, a Y motor for rotating the Y ball screw about its axis, and a pair of Y guide rails for supporting the cutting unit 20 so as to allow the movement thereof in the Y direction. Similarly, the Z moving unit 44 includes a Z ball screw rotatable about its axis extending in the Z direction, a Z motor for rotating the Z ball screw about its axis, and a pair of Z guide rails for supporting the cutting unit 20 so as to allow the movement thereof in the Z direction.

Although not depicted, the cutting apparatus 1 further includes an X position detecting unit for detecting the X position of the holding table 10 in the X direction, a Y position detecting unit for detecting the Y position of the cutting unit 20 in the Y direction, and a Z position detecting unit for detecting the Z position of the cutting unit 20 in the Z direction. The X position detecting unit may be composed of a linear scale extending in the X direction and a read head for reading marks of the linear scale. Similarly, the Y position detecting unit may be composed of a linear scale extending in the Y direction and a read head for reading marks of the linear scale. The Z position detecting unit may detect the Z position of the cutting unit 20 according to the pulses output from the Z motor included in the Z moving unit 44. The X position of the holding table 10 is output from the X position detecting unit to the control unit 100. The Y position of the cutting unit 20 is output from the Y position detecting unit to the control unit 100. The Z position of the cutting unit 20 is output from the Z position detecting unit to the control unit 100.

The cutting apparatus 1 further includes a cassette elevator 50 for mounting a cassette 51 and moving it in the Z direction, a cleaning unit 60 for cleaning the workpiece 200 after cutting, and a transfer unit (not depicted) for transferring the workpiece 200 among the cassette 51, the holding table 10, and the cleaning unit 60. The cassette 51 is so configured as to store a plurality of workpieces 200 before cutting and after cutting. The cutting apparatus 1 further includes a setup mechanism (not depicted) for determining a reference position of the cutting unit 20 in the Z direction where the lower end of the cutting edge of the cutting blade 21-1 comes to lie on the same plane as the holding surface 11 of the holding table 10.

The control unit 100 functions to control each component of the cutting apparatus 1 described above and perform a cutting operation to the workpiece 200 in the cutting apparatus 1. The control unit 100 includes a computer including a computing unit having a microprocessor such as a central processing unit (CPU), a storing unit having a read only memory (ROM), a random access memory (RAM), and a hard disk drive (HDD), for example, and an input/output interface unit. The computing unit of the control unit 100 functions to perform computing according to a computer program stored in the storing unit and output a control signal through the input/output interface unit to each component of the cutting apparatus 1 described above, thereby controlling the cutting apparatus 1.

Although not depicted, the control unit 100 is also connected to a display unit such as a liquid crystal display for displaying an operational condition, an image, etc., and an input unit to be used by an operator in recording information regarding contents of cutting operation, for example. Examples of the input unit include a touch panel provided in the display unit and an external input device such as a keyboard. At least one of the touch panel and the external input device may be used.

As depicted in FIG. 1, the control unit 100 includes a cutting conditions storing portion 110, a cutting operation control portion 120, a shape checking portion 130, and a cut depth setting portion 140. The cutting conditions storing portion 110 functions to store the cutting conditions for the workpiece 200 depicted in FIG. 2. The cutting conditions include set values for the width of a cut groove (i.e., kerf width) and the depth of the cut groove (i.e., cut depth) to be set on each division line 220 in cutting the workpiece 200. The set value for the kerf width may have an allowable range for the kerf width rather than a single value. The allowable range for the kerf width is defined by a lower limit and an upper limit for the width of the cut groove to be formed along each division line 220 in the workpiece 200. For example, in the case that the width of each division line 220 is 300 µm (micrometers), the allowable range for the kerf width is defined as 200 to 250 µm. The cut depth differs according to the workpiece (semiconductor wafer or package substrate) or the cutting method (half cutting or full cutting) and is decided according to the thickness of the workpiece or the cutting method. Further, the cut depth includes a predetermined margin set in consideration of variations in the thickness of the substrate 201-1 and variations in control in the Z direction. With the use of the cutting blade 21-1, the outer circumference of the cutting edge of the cutting blade 21-1 is worn to gradually become round. Accordingly, with the use of the cutting blade 21-1, it is expected that the cut depth by the cutting blade 21-1 may not reach a desired Z position in the Z direction. From this point of view, the predetermined margin is set in the Z direction (i.e., the direction along the thickness of the substrate 201-1) according to variations in the thickness of the substrate 201-1 and variations in control in the Z direction, so that a certain degree of allowance can be ensured in such a manner that the cutting edge of the cutting blade 21-1 can cut the substrate 201-1 to a Z position deeper than the desired Z position.

The cutting operation control portion 120 is a functional portion for controlling the cutting operation of the cutting apparatus 1. The cutting operation control portion 120 functions to set the lower end of the cutting edge of the cutting blade 21-1 to a cutting start position above a predetermined one of the division lines 220. The cutting operation control portion 120 further functions to lower the cutting blade 21-1 set at the cutting start position until the lower end of the cutting edge of the cutting blade 21-1 reaches a predetermined cut depth. The cutting operation control portion 120 further functions to feed the holding table 10 holding the workpiece 200 with respect to the cutting blade 21-1 from the cutting start position toward a cutting end position, thereby cutting the predetermined division line 220 (i.e., cutting the workpiece 200 along the predetermined division line 220). The cutting operation control portion 120 further functions to raise the cutting blade 21-1 after ending the cutting operation along the predetermined division line 220 until the lower end of the cutting edge of the cutting blade 21-1 becomes higher in level than the upper surface of each device 205 of the workpiece 200. Thereafter, the cutting operation control portion 120 further functions to index the cutting blade 21-1 to the position above the next division line 220 adjacent to the above predetermined division line 220 and then similarly perform the cutting operation along this next division line 220. In this manner, the cutting operation for cutting each division line 220 by using the cutting blade 21-1 is controlled by the cutting operation control portion 120.

The shape checking portion 130 is a functional portion for performing a shape checking step ST11 to be hereinafter described. The cut depth setting portion 140 is a functional portion for performing a cut depth setting step ST12 to be hereinafter described.

Figure 4:
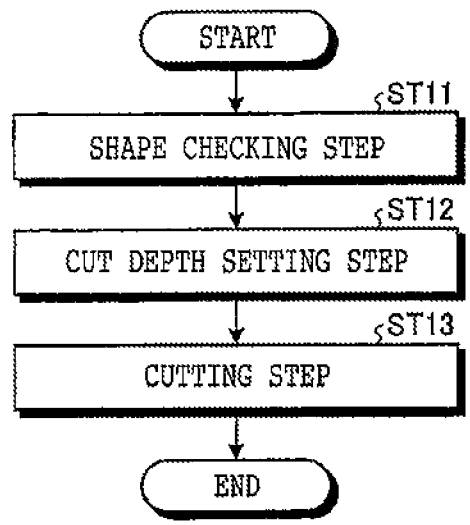
FIG. 4 is a flowchart depicting the procedure of the cutting method according to the first preferred embodiment.

FIG. 4 is a flowchart depicting the procedure of the cutting method according to the first preferred embodiment. The cutting method depicted in FIG. 4 is performed by the components of the control unit 100 described above. As depicted in FIG. 4, the cutting method according to the first preferred embodiment includes a shape checking step ST11, a cut depth setting step ST12, and a cutting step ST13.

Figure 5:
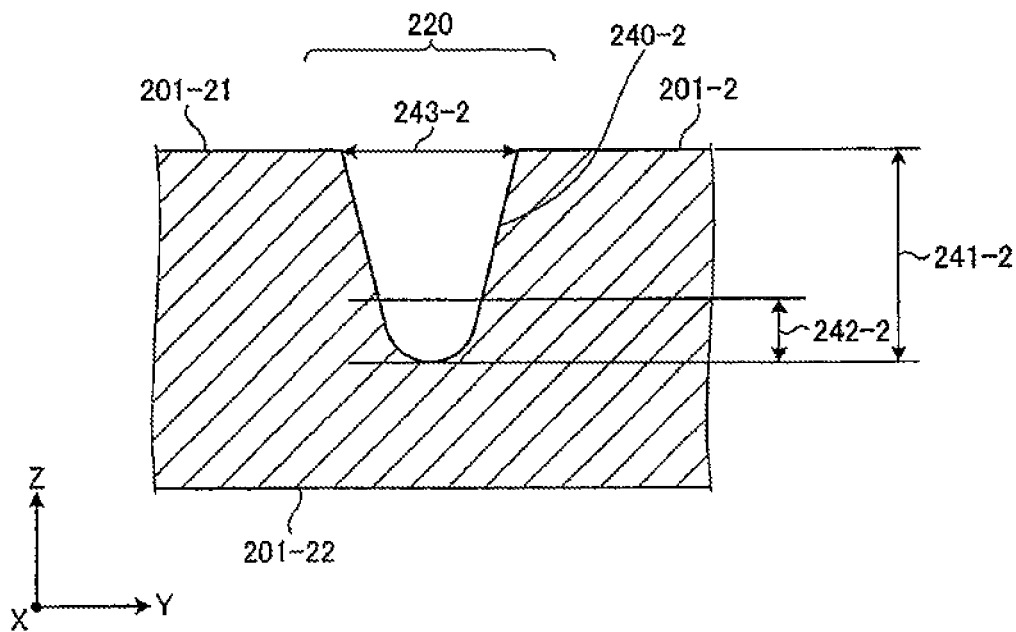
FIG. 5 is a sectional view of an essential part of a dummy workpiece in the condition where a cut groove has been formed in the dummy workpiece by using a cutting blade according to the first preferred embodiment.

The shape checking step ST11 is a step of checking the shape of the cutting blade 21-1. The shape checking step ST11 is performed by the cutting operation control portion 120 and the shape checking portion 130. The shape checking step ST11 includes a transfer step of cutting the dummy workpiece 201-2 by using the cutting blade 21-1 to form a cut groove (kerf) as a test cut groove and thereby transfer the shape of the cutting blade 21-1 to this cut groove formed in the dummy workpiece 201-2, and an imaging step of imaging the cross section of the cut groove formed in the transfer step by using the imaging unit 30. Referring to FIG. 5, there is depicted a sectional shape of a cut groove 240-2 formed in the dummy workpiece 201-2 by using the cutting blade 21-1.

In the transfer step of the shape checking step ST11, the dummy workpiece 201-2 is cut by the cutting blade 21-1 to form the cut groove 240-2 and thereby transfer the shape of the cutting blade 21-1 to the cut groove 240-2. More specifically, in the transfer step, the dummy workpiece 201-2 is cut by the cutting blade 21-1 with a predetermined cut depth 241-2 as depicted in FIG. 5, in which this predetermined cut depth 241-2 is greater than or equal to a cut depth in the workpiece 200 to be actually cut by the cutting blade 21-1. Accordingly, the cut groove 240-2 having a V-shape in cross section is formed in the upper surface 201-21 of the dummy workpiece 201-2 as depicted in FIG. 5, and the V-shape of the cutting blade 21-1 is therefore transferred to the cut groove 240-2. That is, the V-shape of the cut groove 240-2 is identical with the V-shape of the cutting blade 21-1. In the next imaging step, the cross section of the cut groove 240-2 formed in the transfer step is imaged by using the imaging unit 30. More specifically, in the imaging step, the cross section of the cut groove 240-2 formed in the dummy workpiece 201-2 is imaged by using the imaging unit 30 to thereby obtain an image of the cross section of the cut groove 240-2. In imaging the cross section of the cut groove 240-2, one end of the cut groove 240-2 may be imaged horizontally in the X direction or may be imaged vertically in the Z direction. FIG. 5 is a vertical sectional view of an essential part of the dummy workpiece 201-2 in the condition where the cut groove 240-2 has been formed in the dummy workpiece 201-2.

As depicted in FIG. 5, the cut groove 240-2 is formed in the dummy workpiece 201-2 by using the cutting blade 21-1 with the predetermined cut depth 241-2, so that the shape of the cutting blade 21-1 is transferred to the cut groove 240-2 in the shape checking step ST11. Preferably, the dummy workpiece 201-2 is a rectangular workpiece formed of silicon or carbon. Further, as compared with the case that the dummy workpiece 201-2 is a tape, the shape of a cut groove formed in a silicon or carbon workpiece as the dummy workpiece 201-2 can be checked more easily. Further, half cutting is preferably performed to form the cut groove in the dummy workpiece 201-2, rather than full cutting. The cut groove 240-2 has a V-shape corresponding to the shape of a cut groove to be formed in the substrate 201-1 of the workpiece 200 as an actual workpiece. The predetermined cut depth 241-2 includes a predetermined margin 242-2 set in consideration of variations in the thickness of the substrate 201-1 and variations in control in the Z direction. The cut groove 240-2 has a kerf width 243-2 according to the predetermined cut depth 241-2 on the upper surface 201-21 side of the dummy workpiece 201-2.

Figure 6:
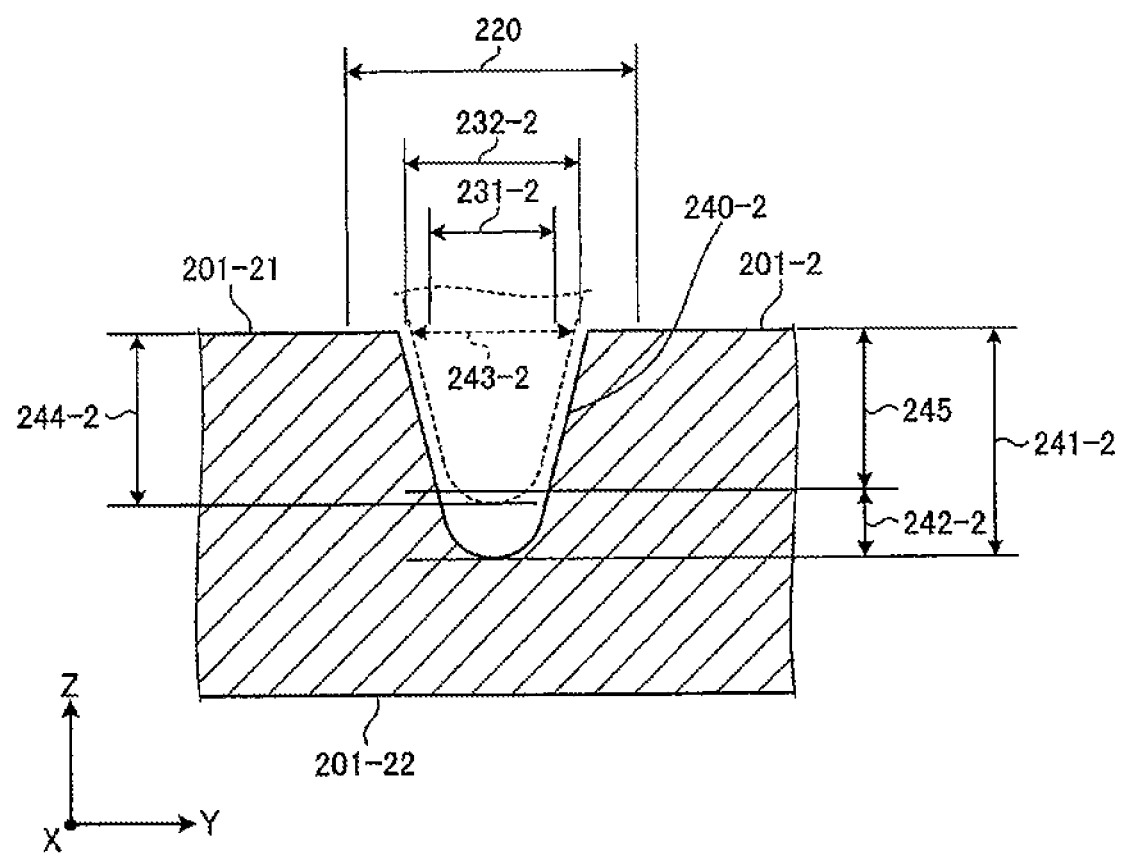
FIG. 6 is a view similar to FIG. 5, depicting a setting method for a cut depth by the cutting blade into the workpiece according to the first preferred embodiment.

Referring back to FIG. 4, the cut depth setting step ST12 is a step of setting a cut depth by the cutting blade 21-1 into the workpiece 200 according to the shape checked in the shape checking step ST11, in which this cut depth is determined such that the width of a cut groove to be formed on the front side of the workpiece 200 (the front side of the substrate 201-1) becomes a previously set value or falls within a previously set allowable range. The cut depth setting step ST12 is performed by the cut depth setting portion 140 in the control unit 100. FIG. 6 is a sectional view similar to FIG. 5, depicting a method of setting the cut depth in the cut depth setting step ST12.

In FIG. 6, the kerf width 243-2 depicted by a broken line is one falling within the previously set allowable range in the cutting conditions previously stored in the cutting conditions storing portion 110, that is, the allowable range of the kerf width in each division line 220. As depicted in FIG. 6, the kerf width 243-2 of the cut groove 240-2 depicted in FIG. 5 does not fall within the above allowable range previously stored in the cutting conditions storing portion 110. That is, the kerf width 243-2 depicted in FIG. 5 does not fall within the range between a lower limit 231-2 and an upper limit 232-2 depicted in FIG. 6. In the cut depth setting step ST12, the cut depth is set such that, when the workpiece 200 is cut at the cut depth 241-2, the kerf width 243-2 of the cut groove 240-2 falls within the allowable range of the kerf width in each division line 220, that is, falls within the range between the lower limit 231-2 and the upper limit 232-2. More specifically, in the cut depth setting step ST12, the predetermined margin 242-2 in the cut depth 241-2 is adjusted (reduced) to thereby make the kerf width 243-2 fall within the range between the lower limit 231-2 and the upper limit 232-2. As a result, the cut depth 241-2 is reduced to a cut depth 244-2 satisfying a necessary cut depth 245. Thus, the cut depth 244-2 is set in the cut depth setting step ST12. After finishing the setting of the cut depth 244-2, the cut depth 244-2 set above is stored into the cutting conditions storing portion 110.

In the case that the cut depth cannot be set in the cut depth setting step ST12 in spite of the adjustment of the predetermined margin 242-2 such that the necessary cut depth is satisfied and the kerf width falls within the allowable range in each division line 220, the operator is prompted to change the cutting blade 21-1. For example, in the cut depth cutting step ST12, a message of prompting the operator to change the cutting blade 21-1 may be displayed, or an audio guidance of prompting the operator to change the cutting blade 21-1 may be output, so that the operator can be prompted to change the cutting blade 21-1.

Referring back to FIG. 4, the cutting step ST13 is a step of cutting the workpiece 200 by using the cutting blade 21-1 with the cut depth 244-2 set in the cut depth setting step ST12, from the front side of the workpiece 200. The cutting step ST13 is performed by the cutting operation control portion 120. In the cutting step ST13, the cutting operation for the workpiece 200, or the substrate 201-1 as an actual workpiece, is performed according to the checking of the shape of the cutting blade 21-1 in the shape checking step ST11 and according to the cut depth set in the cut depth setting step ST12 by using the result of this checking of the shape.

More specifically, in the cutting step ST13, the X moving unit 42 and the Y moving unit 43 of the moving unit 40 are controlled to horizontally move the holding table 10 and the cutting unit 20 and thereby set the lower end of the cutting edge of the cutting blade 21-1 at the cutting start position corresponding to one end of a predetermined one of the division lines 220. At this time, the lower end of the cutting edge of the cutting blade 21-1 is set at the level above the upper surface of each device 205 of the workpiece 200. Thereafter, in the cutting step ST13, the Z moving unit 44 of the moving unit 40 is controlled to lower the cutting blade 21-1 being rotated about its axis and thereby set the lower end of the cutting edge of the cutting blade 21-1 at a vertical position corresponding to the predetermined cut depth set in the cut depth setting step ST12, thereby forcing the cutting blade 21-1 into the substrate 201-1 until reaching the adhesive tape 211. Thereafter, in the cutting step ST13, the X moving unit 42 is controlled to move the holding table 10 holding the workpiece 200 with respect to the cutting blade 21-1 in the X direction, thereby cutting the workpiece 200 along the predetermined division line 220. This cutting operation is similarly repeated along all of the other division lines 220 to thereby cut the workpiece 200 along each division line 220 in the cutting step ST13.

As described above, the cutting method according to the first preferred embodiment includes the shape checking step ST11, the cut depth setting step ST12, and the cutting step ST13. The shape checking step ST11 includes the transfer step and the imaging step, in which the shape of the cutting blade 21-1 is checked by performing the transfer step and the imaging step. In the transfer step, the dummy workpiece 201-2 is cut by using the cutting blade 21-1 to form the cut groove 240-2 in the dummy workpiece 201-2 and thereby transfer the shape of the cutting blade 21-1 to the cut groove 240-2. In the imaging step, the cross section of the cut groove 240-2 is imaged by using the imaging unit 30. In the cut depth setting step ST12, the cut depth by the cutting blade 21-1 into the workpiece 200 is set according to the shape checked in the shape checking step ST11 such that the kerf width 243-2 of the cut groove 240-2 to be formed on the front side of the workpiece 200 becomes a previously set value or falls within a previously set allowable range. In the cutting step ST13, the workpiece 200 is cut by using the cutting blade 21-1 with the cut depth 244-2 set in the cut depth setting step ST12, from the front side of the workpiece 200.

In this manner, in the cutting method according to the first preferred embodiment, the dummy workpiece 201-2 corresponding to the substrate 201-1 as an actual workpiece is cut to form the cut groove 240-2 having a sectional shape transferred from the sectional shape of the cutting blade 21-1. Then, the cross section of the cut groove 240-2 is imaged. Thereafter, the image of the cross section of the cut groove 240-2 is checked. In the case that the kerf width 243-2 of the cut groove 240-2 does not fall within the previously set range, that is, in the case that the kerf width 243-2 exceeds the allowable range in each division line 220, the margin 242-2 included in the cut depth 241-2 is adjusted to set the cut depth 244-2. Thereafter, the substrate 201-1 as an actual workpiece is cut by using the cutting blade 21-1 with the cut depth 244-2 set above. Accordingly, in the cutting method according to the first preferred embodiment, a cut groove can be formed in the workpiece 200 along each division line 220 in the condition where the width of the cut groove is less than the width of each division line 220.

Second Preferred Embodiment

Figure 7:
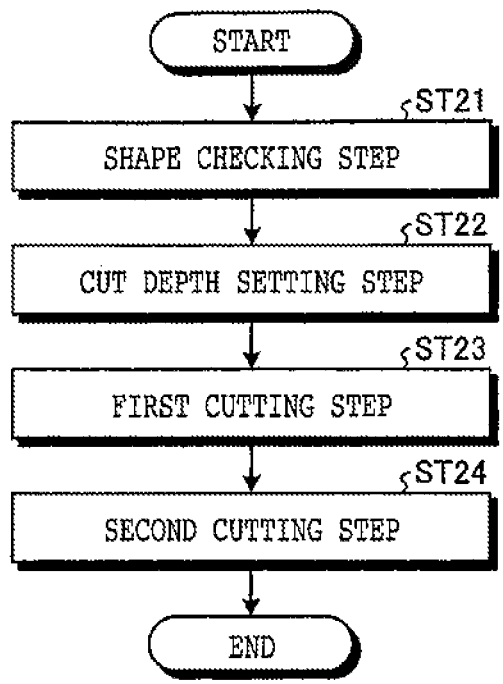
FIG. 7 is a flowchart depicting the procedure of a cutting method according to a second preferred embodiment.

FIG. 7 is a flowchart depicting the procedure of a cutting method according to a second preferred embodiment. The cutting method depicted in FIG. 7 is performed by the components of the control unit 100 depicted in FIG. 1. As depicted in FIG. 7, the cutting method according to the second preferred embodiment includes a shape checking step ST21, a cut depth setting step ST22, a first cutting step ST23, and a second cutting step ST24. The cutting method depicted in FIG. 7 is different from the cutting method depicted in FIG. 4 in only the point that the cutting method depicted in FIG. 7 further includes the second cutting step ST24.

Figure 8:
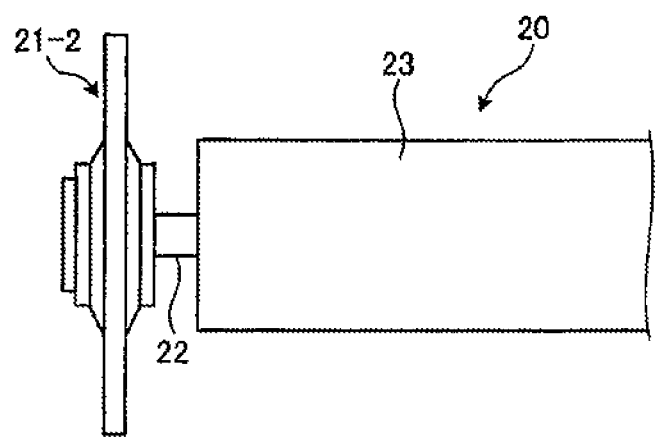
FIG. 8 is a side view of a cutting unit for use in performing the cutting method according to the second preferred embodiment.

FIG. 8 is a side view of a cutting unit 20 according to the second preferred embodiment. The cutting unit 20 depicted in FIG. 8 includes a cutting blade 21-2. The cutting blade 21-2 is an annular cutting wheel formed from abrasive and having a very small thickness. The cutting blade 21-2 depicted in FIG. 8 is different from the cutting blade 21-1 depicted in FIG. 3 in the point that the cutting blade 21-2 has a sectionally rectangular cutting edge having a uniform thickness. The cutting blade 21-2 depicted in FIG. 8 is used in the second cutting step ST24 to be hereinafter described.

The shape checking step ST21 is a step of checking the cutting blade 21-1 depicted in FIG. 3 in a manner similar to that of the shape checking step ST11 depicted in FIG. 4. The cut depth setting step ST22 is a step of setting a cut depth in a manner similar to that of the cut depth setting step ST12 depicted in FIG. 4.

The first cutting step ST23 is a step of cutting the workpiece 200 by using the cutting blade 21-1 with the cut depth set in the cut depth setting step ST22, from the front side of the workpiece 200. The second cutting step ST24 is a step of fully cutting the workpiece 200 half cut in the first cutting step ST23, by using the cutting blade 21-2 depicted in FIG. 8 to thereby divide the workpiece 200. That is, in the first cutting step ST23, the workpiece 200 is half cut along each division line 220 by using the cutting blade 21-1 having a V-shaped cross section to thereby form a sectionally V-shaped cut groove on the front side of the workpiece 200 along each division line 220. Thereafter, in the second cutting step ST24, the workpiece 200 is fully cut along each sectionally V-shaped cut groove by using the cutting blade 21-2 having a rectangular cross section, thereby dividing the workpiece 200 along each division line 220.

Third Preferred Embodiment

Figure 9:
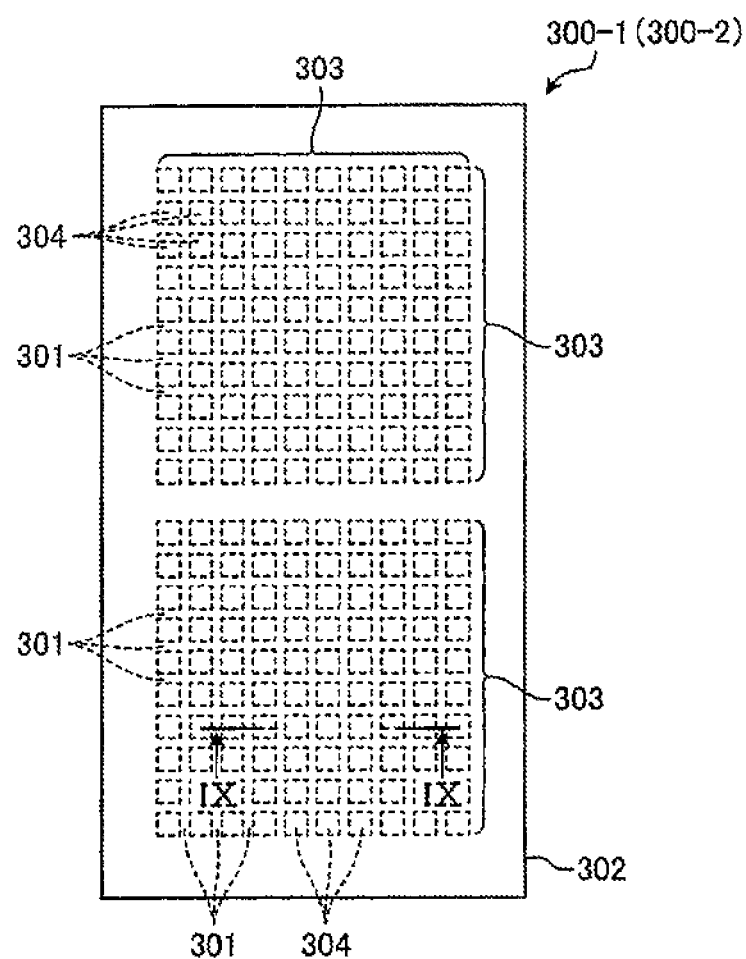
FIG. 9 is a plan view of a package substrate as another workpiece to be cut by performing a cutting method according to a third preferred embodiment.
Figure 10:
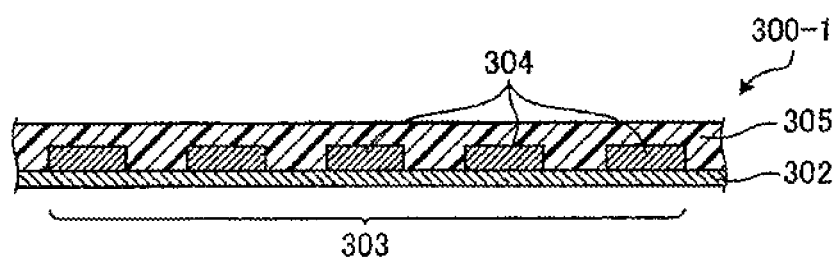
FIG. 10 is a cross section taken along the line IX-IX in FIG. 9.
Figure 11:
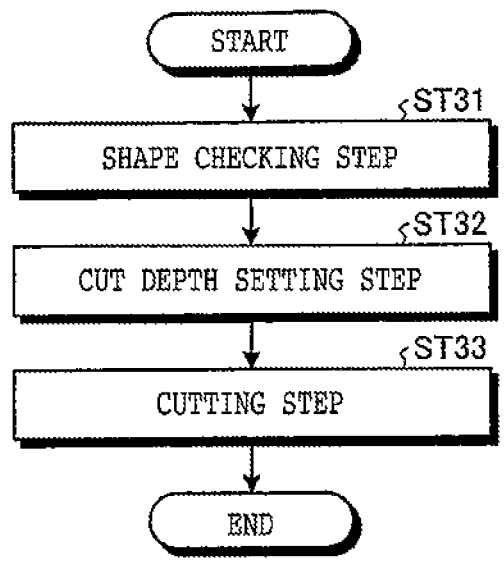
FIG. 11 is a flowchart depicting the procedure of the cutting method according to the third preferred embodiment.

There will now be described a cutting method for a package substrate as a workpiece according to a third preferred embodiment. FIG. 9 is a plan view of a package substrate 300-1 according to the third preferred embodiment. FIG. 10 is a cross section taken along the line IX-IX in FIG. 9. FIG. 11 is a flowchart depicting the procedure of the cutting method according to the third preferred embodiment.

The package substrate 300-1 depicted in FIG. 9 includes a wiring substrate 302 on which a plurality of crossing division lines 301 are formed. The wiring substrate 302 is rectangular as viewed in plan. Two chip areas 303 are formed on the wiring substrate 302.

As depicted in FIG. 10, the package substrate 300-1 further includes a plurality of device chips 304 provided in each chip area 303 on the wiring substrate 302, and a plastic molding layer 305 for covering all the device chips 304. The plural device chips 304 in each chip area 303 on the front side of the package substrate 300-1 are arranged at equal intervals like a matrix, and each division line 301 is formed between any adjacent ones of the plural device chips 304. Further, although not depicted, a wiring layer is provided through an insulating layer between the wiring substrate 302 and each device chip 304.

The plastic molding layer 305 is formed of synthetic resin having an insulation property. The plastic molding layer 305 functions to cover each device chip 304 on the wiring substrate 302 and also cover the wiring layer. The wiring substrate 302 functions to dissipate the heat generated from each device chip 304 to the outside thereof. The package substrate 300-1 is cut by the cutting apparatus 1 depicted in FIG. 1 and thereby divided into the individual device chips 304, in which each device chips 304 is mounted on a part of the wiring substrate 302 and sealed with a part of the plastic molding layer 305.

As depicted in FIG. 11, the cutting method according to the third preferred embodiment includes a shape checking step ST31, a cut depth setting step ST32, and a cutting step ST33. The cutting method depicted in FIG. 11 is performed by the components of the control unit 100 depicted in FIG. 1.

The shape checking step ST31 is a step similar to the shape checking step ST11 depicted in FIG. 4. The shape checking step ST31 includes a transfer step of cutting a dummy workpiece 300-2 by using the cutting blade 21-1 to form a cut groove in the dummy workpiece 300-2 and thereby transfer the shape of the cutting blade 21-1 to this cut groove, and an imaging step of imaging the cross section of this cut groove by using the imaging unit 30.

Figure 12:
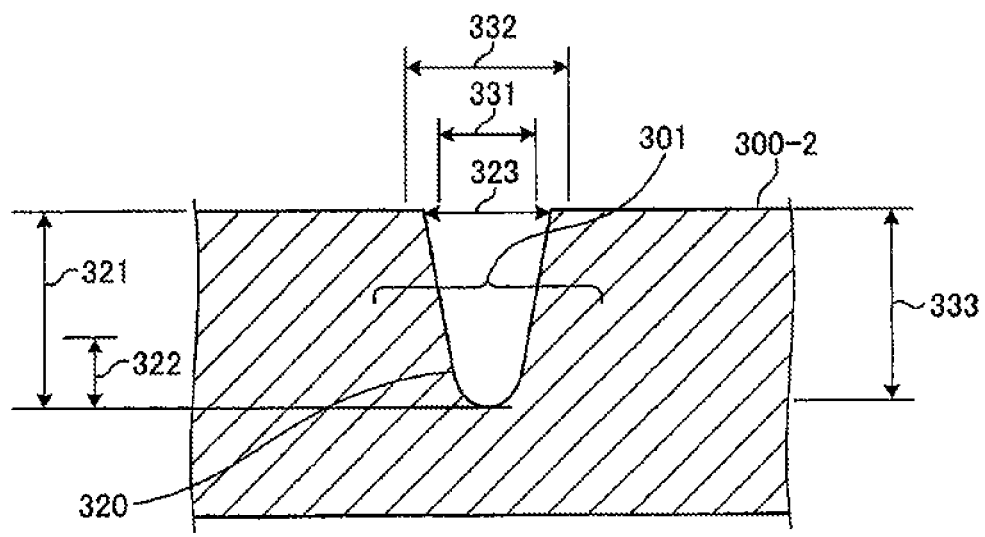
FIG. 12 is a sectional view depicting a setting method for a cut depth in the cutting method according to the third preferred embodiment.

Referring to FIG. 12, there is depicted a sectional shape of a cut groove 320 formed in the dummy workpiece 300-2 by using the cutting blade 21-1. In the transfer step of the shape checking step ST31, the dummy workpiece 300-2 is cut by the cutting blade 21-1 to form the cut groove 320 and thereby transfer the shape of the cutting blade 21-1 to the cut groove 320. More specifically, in the transfer step, the dummy workpiece 300-2 is cut by the cutting blade 21-1 with a predetermined cut depth 321 as depicted in FIG. 12. That is, the lower end of the cutting edge of the cutting blade 21-1 is positioned at the predetermined cut depth 321 from the upper surface of the dummy workpiece 300-2. Accordingly, the cut groove 320 having a V-shape in cross section is formed in the upper surface of the dummy workpiece 300-2 as depicted in FIG. 12, and the V-shape of the cutting blade 21-1 is therefore transferred to the cut groove 320. In the next imaging step, the cross section of the cut groove 320 formed in the dummy workpiece 300-2 is imaged by using the imaging unit 30 to thereby obtain an image of the cross section of the cut groove 320.

The cut depth setting step ST32 is a step similar to the cut depth setting step ST12 depicted in FIG. 4. FIG. 12 is a vertical sectional view of an essential part of the dummy workpiece 300-2 in the condition where the cut groove 320 has been formed in the dummy workpiece 300-2. FIG. 12 depicts a method of setting a cut depth by the cutting blade 21-1 into the package substrate 300-1.

The dummy workpiece 300-2 is a rectangular workpiece having a thickness larger than or equal to the thickness of the package substrate 300-1, for example. As a modification, the shape of the cutting blade 21-1 may be checked by using a package substrate having the same shape and configuration as those of the actual workpiece (i.e., the package substrate 300-1) or by using the actual workpiece and then cutting a peripheral portion where no devices are formed.

In the shape checking step ST31 depicted in FIG. 11, the cut groove 320 formed in the dummy workpiece 300-2 has a V-shape corresponding to the V-shape of the cutting blade 21-1 and has the predetermined cut depth 321. The predetermined cut depth 321 is a depth enough to divide a layer corresponding to the wiring substrate 302 of the package substrate 300-1. The predetermined cut depth 321 includes a predetermined margin 322 set in consideration of variations in the thickness of the package substrate 300-1 to be actually cut and variations in control in the Z direction. The cut groove 320 has a kerf width 323 according to the predetermined cut depth 321 in the upper surface of the dummy workpiece 300-2 (on the front side where the lower end of the cutting edge of the cutting blade 21-1 is forced into the dummy workpiece 300-2).

In the next cut depth setting step ST32 depicted in FIG. 11, a cut depth by the cutting blade 21-1 into the package substrate 300-1 is set such that the kerf width 323 of the cut groove 320 falls within a previously set allowable range included in the cutting conditions, that is, falls within an allowable range in each division line 301. More specifically, as depicted in FIG. 12, the cut depth is set in the cut depth setting step ST32 in such a manner that the predetermined margin 322 is adjusted to thereby make the kerf width 323 fall within the range between a lower limit 331 and an upper limit 332 and also make the cut depth 321 change to a necessary cut depth (e.g., depth 333) for the division of the wiring substrate 302. After finishing the setting of the cut depth, the cut depth set above is stored into the cutting conditions storing portion 110 of the control unit 100 depicted in FIG. 1 in the cut depth setting step ST32.

In the case that the cut depth cannot be set in the cut depth setting step ST32 in spite of the adjustment of the predetermined margin 322 such that the necessary cut depth is satisfied and the kerf width falls within the allowable range in each division line 301, the operator is prompted to change the cutting blade 21-1. For example, in the cut depth setting step ST32, a message of prompting the operator to change the cutting blade 21-1 may be displayed, or an audio guidance of prompting the operator to change the cutting blade 21-1 may be output, so that the operator can be prompted to change the cutting blade 21-1.

Referring back to FIG. 11, the cutting step ST33 is a step of cutting the package substrate 300-1 by using the cutting blade 21-1 with the cut depth set in the cut depth setting step ST32, from the front side of the package substrate 300-1 (i.e., from the upper surface of the plastic molding layer 305). In the cutting step ST33, the cutting operation for the package substrate 300-1 as an actual workpiece is performed according to the checking of the shape of the cutting blade 21-1 in the shape checking step ST31 and according to the cut depth set in the cut depth setting step ST32 by using the result of this checking of the shape.

Fourth Preferred Embodiment

There will now be described a cutting method according to a fourth preferred embodiment. In the cutting method according to the fourth preferred embodiment, the package substrate 300-1 is cut by using the cutting blade 21-1 in the condition that the cut depth is set to a depth from the upper surface of the plastic molding layer 305 to the upper surface of the wiring substrate 302.

Figure 13:
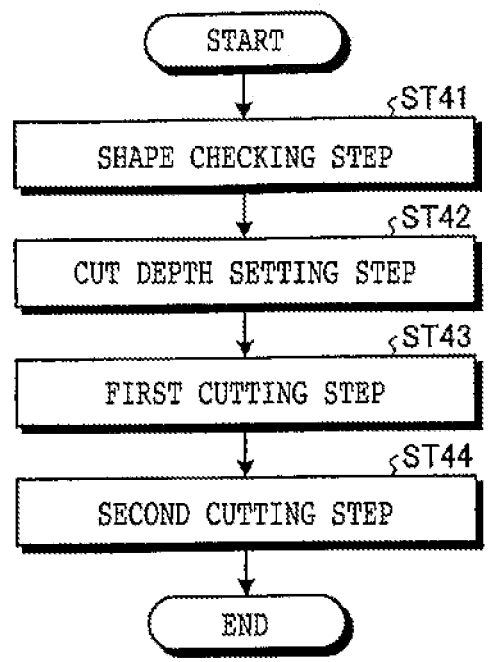
FIG. 13 is a flowchart depicting the procedure of a cutting method according to a fourth preferred embodiment.

FIG. 13 is a flowchart depicting the procedure of the cutting method according to the fourth preferred embodiment. The cutting method depicted in FIG. 13 is performed by the components of the control unit 100 depicted in FIG. 1. As depicted in FIG. 13, the cutting method according to the fourth preferred embodiment includes a shape checking step ST41, a cut depth setting step ST42, a first cutting step ST43, and a second cutting step ST44. The cutting method depicted in FIG. 13 is different from the cutting method depicted in FIG. 11 in only the point that the cutting method depicted in FIG. 13 further includes the second cutting step ST44.

Figure 14:
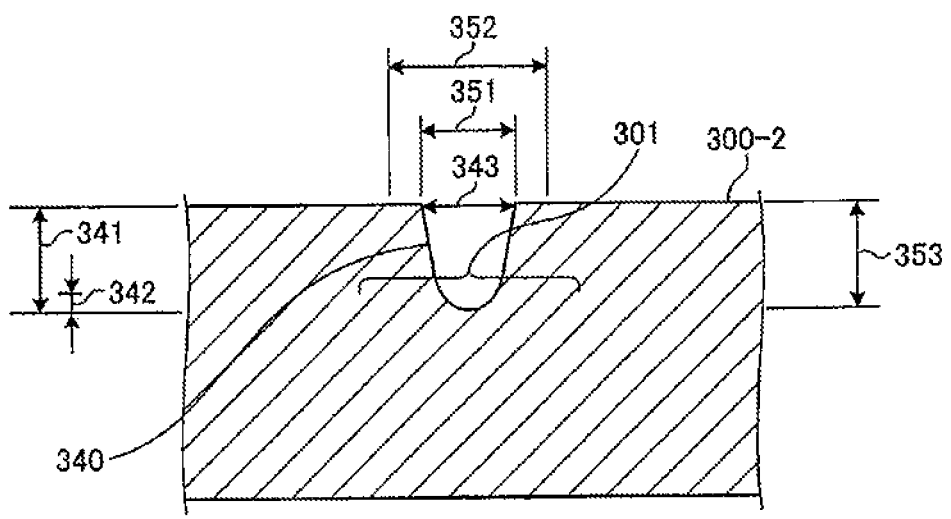
FIG. 14 is a sectional view depicting a setting method for a cut depth in the cutting method according to the fourth preferred embodiment.

The shape checking step ST41 is a step of checking the shape of the cutting blade 21-1 as similar to the shape checking step ST31 depicted in FIG. 11. The cut depth setting step ST42 is a step similar to the cut depth setting step ST32 depicted in FIG. 11. FIG. 14 is a sectional view depicting a setting method for the cut depth in the fourth preferred embodiment.

In the shape checking step ST41 depicted in FIG. 13, the dummy workpiece 300-2 is cut by the cutting blade 21-1 to form a cut groove 340 in the upper surface of the dummy workpiece 300-2 as depicted in FIG. 14. The cut groove 340 has a predetermined cut depth 341 corresponding to the thickness of the plastic molding layer 305 of the package substrate 300-1. That is, the cut groove 340 is formed in an imaginary layer of the dummy workpiece 300-2, the imaginary layer corresponding to the plastic molding layer 305 of the package substrate 300-1. Thus, the shape of the cutting blade 21-1 is transferred to the cut groove 340. In other words, the predetermined cut depth 341 corresponds to a depth from the upper surface of the plastic molding layer 305 at least to the upper surface of the wiring substrate 302 of the package substrate 300-1. The predetermined cut depth 341 includes a predetermined margin 342 set in consideration of variations in the thickness of the package substrate 300-1 and variations in control in the Z direction. The cut groove 340 has a kerf width 343 according to the predetermined cut depth 341 in the upper surface of the dummy workpiece 300-2 (on the front side where the lower end of the cutting edge of the cutting blade 21-1 is forced into the dummy workpiece 300-2).

In the next cut depth setting step ST42 depicted in FIG. 13, a cut depth by the cutting blade 21-1 into the package substrate 300-1 is set such that the kerf width 343 of the cut groove 340 falls within a previously set allowable range included in the cutting conditions, that is, falls within an allowable range in each division line 301. More specifically, as depicted in FIG. 14, the cut depth is set in the cut depth setting step ST42 in such a manner that the predetermined margin 342 is adjusted to thereby make the kerf width 343 fall within the range between a lower limit 351 and an upper limit 352 and also make the cut depth 341 change to a necessary cut depth (e.g., depth 353) for the condition that the bottom of the cut groove reaches the upper surface of the wiring substrate 302. After finishing the setting of the cut depth, the cut depth set above is stored into the cutting conditions storing portion 110 of the control unit 100 depicted in FIG. 1 in the cut depth setting step ST42.

In the case that the cut depth cannot be set in the cut depth setting step ST42 in spite of the adjustment of the predetermined margin 342 such that the necessary cut depth is satisfied and the kerf width falls within the allowable range in each division line 301, the operator is prompted to change the cutting blade 21-1. For example, in the cut depth setting step ST42, a message of prompting the operator to change the cutting blade 21-1 may be displayed, or an audio guidance of prompting the operator to change the cutting blade 21-1 may be output, so that the operator can be prompted to change the cutting blade 21-1.

Referring back to FIG. 13, the first cutting step ST43 is a step of cutting the package substrate 300-1 by using the cutting blade 21-1 with the cut depth set in the cut depth setting step ST42, from the front side of the package substrate 300-1 (i.e., from the upper surface of the plastic molding layer 305). In the first cutting step ST43, the cutting operation for the plastic molding layer 305 of the package substrate 300-1 as an actual workpiece is performed according to the checking of the shape of the cutting blade 21-1 in the shape checking step ST41 and according to the cut depth set in the cut depth setting step ST42 by using the result of this checking of the shape. That is, in the first cutting step ST43, the plastic molding layer 305 is cut by using the cutting blade 21-1 with the cut depth from the upper surface of the plastic molding layer 305 at least to the upper surface of the wiring substrate 302.

In the next second cutting step ST44 depicted in FIG. 13, the package substrate 300-1 is further cut along the cut groove formed to divide the plastic molding layer 305 in the first cutting step ST43, by using the cutting blade 21-2 depicted in FIG. 8 to thereby divide the wiring substrate 302. That is, the second cutting step ST44 is a step of fully cutting the wiring substrate 302 of the package substrate 300-1 along the cut groove formed in the first cutting step ST43, by using the cutting blade 21-2 to thereby divide the wiring substrate 302.

[Modification]

While the cutting methods according to the third preferred embodiment and the fourth preferred embodiment are applied to the package substrate 300-1 having the wiring substrate 302, these cutting methods may also be applied similarly to a package substrate having a redistribution layer formed on a semiconductor wafer.

Further, in each preferred embodiment, the cut depth by the cutting blade 21-1 into the workpiece may be set according to the shape checked in the shape checking step such that the kerf width of the cut groove to be formed on the front side of the workpiece becomes a previously set value. That is, the kerf width of the cut groove to be formed on the front side of the workpiece may be previously set to a value (e.g., 250 μm) less than the width of each division line. In this case, the cut depth is set in the cut depth setting step in such a manner that the distance from the lower end of the V-shaped cutting edge of the cutting blade 21-1 to a position where the thickness of the cutting edge of the cutting blade 21-1 becomes the previously set value (e.g., 250 μm) for the kerf width of the cut groove, so that this distance is the same as the cut depth corresponding to the kerf width on the front side of the workpiece. This setting method is depicted in FIG. 15, which is a sectional view according to a modification.

Figure 15:
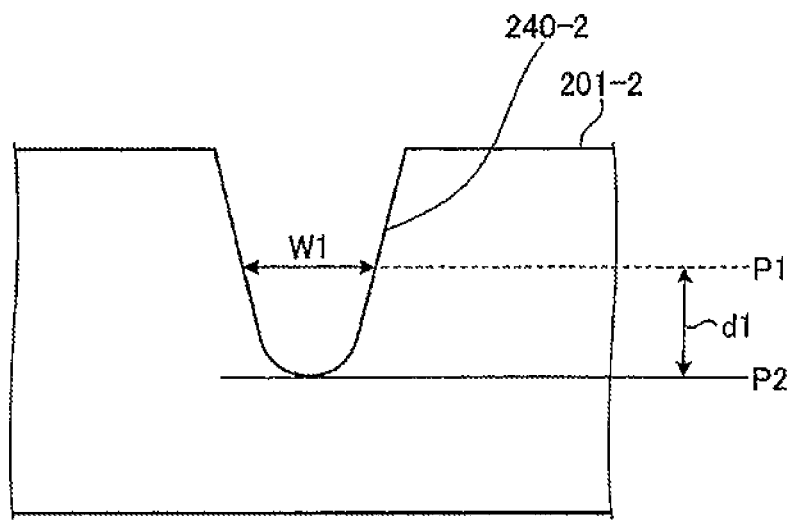
FIG. 15 is a sectional view depicting a setting method for a cut depth according to a modification.

As depicted in FIG. 15, the dummy workpiece 201-2 is cut by using the cutting blade 21-1 to form the cut groove 240-2 having a V-shaped cross section. In FIG. 15, reference symbol W1 denotes a kerf width (e.g., 250 μm) of a cut groove to be formed in the upper surface of each division line of the actual workpiece (the substrate 201-1). Then, a vertical position in the cut groove 240-2 corresponding to the kerf width W1 is detected. For example, this vertical position in the cut groove 240-2 corresponding to the kerf width W1 is denoted by reference symbol P1 in FIG. 15. Further, reference symbol P2 denotes the vertical position of the bottom of the cut groove 240-2 (i.e., the vertical position of the lower end of the cutting edge of the cutting blade 21-1 in forming the cut groove 240-2). In the case that the vertical position P1 in the cut groove 240-2 corresponding to the kerf width W1 is detected, the cut depth by the cutting blade 21-1 into the actual workpiece is set such that the vertical position P1 becomes a position lying on the front side of the actual workpiece in the cut depth setting step. More specifically, the distance d1 between the vertical position P1 and the vertical position P2 in the cut groove 240-2 is calculated. Then, this distance d1 calculated is set as the cut depth from the front side of the actual workpiece. In the case that the cut depth set above is less than a desired cut depth when the cut depth is set such that the kerf width W1 of the cut groove to be formed in the upper surface of each division line corresponds to the front side of the actual workpiece, the operator may be prompted to change the cutting blade 21-1. Alternatively, the cutting blade 21-1 may be suitably dressed to recover the original V-shaped cross section.

While the above preferred embodiments of the present invention have been described, the present invention is not limited to the above preferred embodiments. For example, the imaging step included in the shape checking step (ST11, ST21, ST31, or ST41) is not particularly limited in its method of imaging the cross section of the cut groove (240-2, 320, or 340). For example, the dummy workpiece may be mounted on the holding table 10 in the condition where the cross section of the cut groove is oriented upward, and the cross section of the cut groove may be imaged by using an electron microscope included in the cutting apparatus 1. Further, the shape checking step (ST11, ST21, ST31, or ST41) is preferably performed repeatedly in the cutting operation for the workpiece 200 or the package substrate 300-1, and at the time the cut depth cannot be set, the operator is preferably prompted to change the cutting blade 21-1.

Further, the dummy workpiece may be a package substrate having the same shape and configuration as those of the actual workpiece (i.e., package substrate 301-1). As a modification, the shape of the cutting blade 21-1 may be checked by using the actual workpiece and then cutting a peripheral portion where no devices are formed. Further, in the shape checking step, the V-shape of the cutting blade 21-1 may be directly imaged without forming a cut groove in the dummy workpiece.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece cutting method of cutting a workpiece along a plurality of crossing division lines formed on a front side of the workpiece, by using a first cutting blade having a thickness gradually decreasing toward an outer circumference of the cutting blade and a second cutting blade having a rectangular cross section, the workpiece cutting method comprising:

a shape checking step of checking a shape of the cutting blade by using the first cutting blade to form a test cut groove in a dummy workpiece having a predetermined cut depth greater than a cut depth of a cut groove to be formed on the workpiece, thereby transferring the shape of the cutting blade to the test cut groove;

a cut depth setting step of setting the cut depth of the cut groove to be formed on the workpiece by the first cutting blade according to the shape checked in the shape checking step such that a width of the cut groove to be formed on the workpiece on the front side of the workpiece becomes a previously set value by reducing the cut depth of the cut groove to be formed on the workpiece to be smaller than the predetermined cut depth of the test cut groove;

a first cutting step of cutting the workpiece with the cut depth set in the cut depth setting step, by forcing the first cutting blade into the workpiece from the front side thereof along a select division line; and a second cutting step of fully cutting the workpiece along the select division line cut by the first cutting blade, using the second cutting blade.

2. The workpiece cutting method according to claim 1, wherein the shape checking step comprises:

an imaging step of imaging a cross section of the test cut groove formed in the transfer step.

3. The workpiece cutting method according to claim 1, wherein the workpiece is a package substrate including:

a wiring substrate having a front side partitioned by the division lines to define a plurality of separate regions;

a plurality of chips individually provided in the plurality of separate regions on the front side of the wiring substrate; and a plastic molding layer for sealing the plurality of chips with resin;

the front side of the package substrate as the workpiece being an upper surface of the plastic molding layer from which the cutting blade is forced into the package substrate in the cutting step.

4. The workpiece cutting method according to claim 1, wherein the cut depth of the cut groove to be formed on the workpiece is reduced from the predetermined cut depth of the test cut groove to be within a predetermined margin.

* * * * *